(12) United States Patent
Kishore Kumar et al.

(10) Patent No.: US 12,312,680 B2
(45) Date of Patent: May 27, 2025

(54) PLASMA ENHANCED CHEMICAL VAPOR DEPOSITION OF GRAPHENE ON OPTICAL FIBERS

(71) Applicant: California Institute of Technology, Pasadena, CA (US)

(72) Inventors: Deepan Kishore Kumar, San Jose, CA (US); Nai-Chang Yeh, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 186 days.

(21) Appl. No.: 18/086,996

(22) Filed: Dec. 22, 2022

(65) Prior Publication Data

US 2023/0212743 A1 Jul. 6, 2023

Related U.S. Application Data (60) Provisional application No. 63/295,086, filed on Dec. 30, 2021.

(51) Int. Cl.
| | |
|---|---|
| *C23C 16/26* | (2006.01) |
| *C23C 16/511* | (2006.01) |
| *H01J 37/32* | (2006.01) |

(52) U.S. Cl.
CPC ............ *C23C 16/26* (2013.01); *C23C 16/511* (2013.01); *H01J 37/32449* (2013.01); *H01J 37/32743* (2013.01); *H01J 37/32816* (2013.01); *H01J 2237/3321* (2013.01)

(58) Field of Classification Search
CPC .............................. C23C 16/26; C23C 16/511
See application file for complete search history.

(56) References Cited

U.S. PATENT DOCUMENTS

| 5,687,271 A | * | 11/1997 | Rabinowitz | .......... G02B 6/4419 |
| | | | | 385/100 |
| 2019/0093227 A1 | * | 3/2019 | Yeh | ........................ C23C 16/513 |

OTHER PUBLICATIONS

Yang et al. Direct growth of a graphitic nano-layer on optical fibers for ultra-fast laser application, RSC Adv., 2017, 7, 52261-52265. (Year: 2017).*

* cited by examiner

*Primary Examiner* — Kelly M Gambetta
(74) *Attorney, Agent, or Firm* — Kilpatrick Townsend & Stockton LLP (57) ABSTRACT

A method of growing one or more graphene sheets on one or more regions of an optical fiber using plasma-enhanced chemical vapor deposition (PECVD) includes placing the optical fiber in a growth chamber, placing one or more carbon-containing precursors in the growth chamber, forming a reduced pressure in the growth chamber, and flowing methane gas and hydrogen gas into the growth chamber. The method also includes generating a plasma in the growth chamber, forming a gaseous carbon-containing precursor from the one or more carbon-containing precursors, exposing the one or more regions of the optical fiber to the methane gas, the hydrogen gas, the gaseous carbon-containing precursor, and the plasma, and forming the one or more graphene sheets on the one or more regions of the optical fiber.

20 Claims, 12 Drawing Sheets

PLASMA ENHANCED CHEMICAL VAPOR DEPOSITION OF GRAPHENE ON OPTICAL FIBERS

CROSS-REFERENCES TO RELATED APPLICATIONS

This application claims benefit under 35 USC§ 119(e) to U.S. Provisional Patent Application No. 63/295,086 filed Dec. 30, 2021 entitled "Plasma Enhanced Chemical Vapor Deposition Of Graphene On Optical Fibers," the disclosure of which is hereby incorporated by reference in its entirety.

STATEMENT AS TO RIGHTS TO INVENTIONS MADE UNDER FEDERALLY SPONSORED RESEARCH AND DEVELOPMENT

This invention was made with government support under Grant No. 1733907 awarded by the National Science Foundation and under Grant No. W911NF-16-1-0472 awarded by the Army. The government has certain rights in the invention.

BACKGROUND OF THE INVENTION

Graphene is composed of a one atom-thick planar sheet of $sp^2$-bonded carbon atoms perfectly arranged in a honeycomb lattice. Graphene has many remarkable properties such as high mechanical strength (high Young's modulus of 1 TPa), thermal properties (high thermal conductivity>3,000 WmK-1), and excellent optical characteristics including broadband optical absorption in near infrared and visible range, and nonlinear optical properties, such as saturation absorption. Due to its unique optical and electrical properties, graphene is widely used in photonic and optoelectronic devices, such as polarizers, optical modulators, ultrafast lasers, sensors, photodetectors and light-emitting diodes.

Despite the progress made in the area of graphene growth, there is a need in the art for improved methods and systems related to growth of graphene on optical fibers.

SUMMARY OF THE INVENTION

Embodiments of the present invention relate to graphene growth. More particularly, embodiments of the present invention provide methods and systems for growing graphene on one or more predetermined regions of an optical fiber. In a specific embodiment, a plasma enhanced chemical vapor deposition system utilizes solid precursors to grow graphene on optical fibers. The present invention is applicable to a variety of graphene growth systems.

As described herein, an embodiment of the present invention provides methods and systems useful for graphene growth on optical fiber using plasma enhanced chemical vapor deposition (PECVD) with methane and hydrogen feedstock gases, along with a solid precursor of aromatic molecules (for example, phenol, pyrene, naphthalene, and/or their halogen substituted versions (i.e., precursors including halogen functional groups)), which can be sublimed under low chamber pressure with low plasma power.

The direct growth of graphene on optical fibers is an extremely important technological milestone that can enable cheaper optical biosensors, on-chip optical modulators, photodetectors, coherent light sources, neural probes for optogenetic interfacing, optical stimulation for drug delivery, in-vivo spectroscopy for disease biomarkers, etc.

According to an embodiment of the present invention, a method of growing one or more graphene sheets on one or more regions of an optical fiber using plasma-enhanced chemical vapor deposition (PECVD) is provided. The method includes placing the optical fiber in a growth chamber, placing one or more carbon-containing precursors in the growth chamber, forming a reduced pressure in the growth chamber, and flowing methane gas and hydrogen gas into the growth chamber. In some embodiments, prior to placing the optical fiber in the growth chamber, the method includes removing a portion of a cladding in the one or more regions of the optical fiber. The one or more carbon-containing precursors can include comprise benzene, $C_6$, or an aromatic compound, or one or more halogen functional groups. The one or more carbon-containing precursors can include a liquid precursor. The method also includes generating a plasma (e.g., a microwave plasma) in the growth chamber, forming a gaseous carbon-containing precursor from the one or more carbon-containing precursors, exposing the one or more regions of the optical fiber to the methane gas, the hydrogen gas, the gaseous carbon-containing precursor, and the plasma, and forming the one or more graphene sheets on the one or more regions of the optical fiber. During generation of the plasma, the growth surface of the optical fiber can be characterized by a growth temperature less than 500° C., for example less than 70° C. In other embodiments, the growth temperature is greater than 100° C. and less than 500° C.

According to another embodiment of the present invention, a method of fabricating a graphene coated optical fiber is provided. The method includes providing a substrate including PECVD-grown graphene, immersing the substrate including PECVD-grown graphene in a solvent, and separating the PECVD-grown graphene from the substrate to form a graphene dispersion. The method also includes immersing an optical fiber in the graphene dispersion, evaporating the solvent from the graphene dispersion, and coating the optical fiber with the PECVD-grown graphene.

Numerous benefits are achieved by way of the present invention over conventional techniques. For example, embodiments of the present invention provide graphene on optical fibers that can be used for a variety of applications, including: pathogen detection, chemical sensing, gas sensing, optical modulation, producing nanoscale light emission, acting as a broadband photodetector, inducing deep brain optical stimulation, other biomedical applications involving the measurement of an antigen-antibody binding chemistry, and the like. These and other embodiments of the invention, along with many of its advantages and features, are described in more detail in conjunction with the text below and attached figures.

DETAILED DESCRIPTION OF THE INVENTION

Undoubtedly, graphene has been widely employed in the design of surface-enhanced Raman spectroscopy (SERS) substrates. Graphene has overcome some of the limitations of the SERS substrates since it endows the SERS substrates with better stability, sensitivity, reproducibility, and biocompatibility. More importantly, high-performance graphene-based substrates have great application potential in numerous fields. Various biomarkers and biomolecules, such as DNA, nucleosides, proteins, bacteria, and fungi have been successfully detected through the employment of multiple graphene-based substrates. In addition, graphene-based substrates have been shown to be effective for bio-imaging, cancer diagnostics, drug delivery, photothermal therapy and chemotherapy. SERS substrates with thiolated graphene oxide (tGO) nanosheets sandwiched between two layers of closely packed plasmonic nanoparticles have been developed. Herein, tGO can play multifunctional roles as a 2D scaffold to immobilize interfacial assembled plasmonic nanoparticles, a nano spacer to create SERS-active nanogaps between two layers of nanoparticle arrays, and a molecule harvester to enrich molecules of interest via π-π interaction. Furthermore, it has been demonstrated that a SERS assay based on the PEGylated substrate, in combination with magnetic separation, allows for sensitive, multiplexed "signal-off" detection of DNA sequences of bacterial pathogens. Cell imaging is a powerful method to reveal mechanisms and cellular processes and to diagnose diseases.

Graphene and its derivatives-based optical sensors covering aspects related to fluorescence, graphene-based SERS substrates, optical fiber biological sensors, and other kinds of graphene-based optical sensors have been reported. Various sensing applications, such as single-cell detection, cancer diagnosis, protein, and DNA sensing, have been introduced.

Conventional graphene growth methods have not demonstrated the commercially viable integration of graphene on the backbone of modern data communication or optical fibers or in the context of silicon photonic waveguides. One challenge presented by conventional graphene growth methods is the use of high-temperature CVD processes, which lead to thermal damage to the core and the cladding of the optical fiber, thereby rendering the optical fiber useless for carrying optical data after the high-temperature CVD processes.

Embodiments of the present invention provide methods and systems for graphene growth on an optical fiber. As an example, for an optical fiber with a portion of the cladding removed, graphene grown on the optical fiber can be biased using an electrode, for example, a metal contact or an electrically conductive portion of a silicon on insulator device, thereby modulating the effective refractive index of the optical fiber in the region of the optical fiber coated with graphene. As will be evident to one of skill in the art, this modulation of the effective refractive index of the optical fiber can be utilized in an optical modulator. The graphene growth can be considered as a quasi-one-dimensional growth process, enabling the fabrication of devices in waveguide geometries.

In other embodiments, the thickness of a multi-layer graphene film is varied as a function of position, resulting in a first region of the optical fiber being characterized by a higher extinction coefficient and a second region of the optical fiber being characterized by a lower extinction coefficient. In a manner similar to optical modulators based on graphene on silicon, in which the conductivity is controlled as a function of gate voltage, embodiments of the present invention can modulate the optical properties, particularly the dielectric properties, of the optical fiber, including absorption, of the optical fiber. The thickness of the graphene, the patterning of the graphene, and the like can be utilized in designing the optical modulators.

Figure 1:
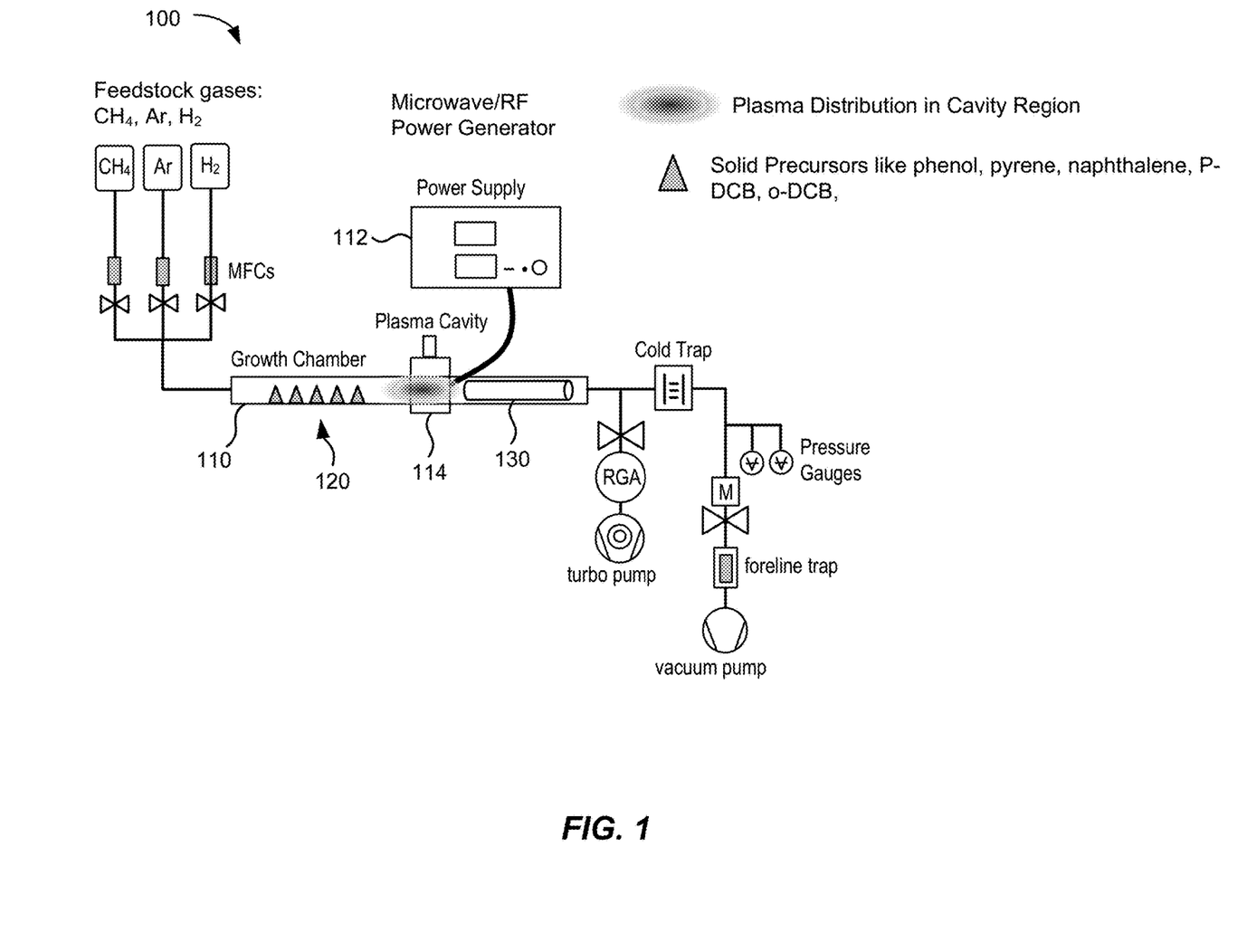
FIG. 1 is a simplified schematic diagram illustrating a plasma enhanced chemical vapor deposition system including solid precursor(s) and an optical fiber according to an embodiment of the present invention.

FIG. 1 is a simplified schematic diagram 100 illustrating a plasma enhanced chemical vapor deposition (PECVD) system including solid precursor(s) and an optical fiber according to an embodiment of the present invention. Referring to FIG. 1, feedstock gases, for example, methane, argon, hydrogen, and the like, are provided, with flow control implemented using mass flow controllers (MFCs). The feedstock gases are fed into a growth chamber 110, which can be implemented using a quartz chamber with an outer diameter that is impedance matched to support plasma excitation on an Evenson cavity, or other microwave plasma cavities (such as McCarroll cavity, cylindrical cavity). The plasma excitation is then utilized to grow graphene on optical fiber 130 positioned in growth chamber 110. In the embodiment illustrated in FIG. 1, a 2.45 GHz microwave source was utilized for graphene growth, but other RF sources can also be used in other embodiments. The plasma is characterized by a peak intensity that is located at a peak location.

The PECVD graphene growth system shown in FIG. 1 has several distinctions with respect to conventional graphene growth systems. As an example, the PECVD graphene growth system shown in FIG. 1 utilizes one or more solid precursors 120 positioned in growth chamber 110 at a location between the feedstock gases and plasma cavity 114 and optical fiber 130 positioned in growth chamber 110 at a location between plasma cavity 114 and the vacuum pumps. Thus, the one or more solid precursors 120 are positioned "upstream" of plasma cavity 114 in order to produce precursor radicals that are present in the vicinity of optical fiber 130 that is positioned "downstream" of plasma cavity 114.

This positioning of the one or more solid precursors 120 upstream of the plasma cavity prevents carbonization of the solid precursors by the plasma, which occurs if the solid precursors are too close to the peak intensity of the plasma. Additionally, this positioning of the optical fiber at a location downstream of the plasma cavity enables the optical fiber to not be exposed to the most intense plasma present in the system. It should be noted that locating the one or more solid precursors and the optical fiber corresponding distances from the peak location corresponding to the peak intensity of the plasma reduces the impact of transients, which can result in high peak intensities as the plasma is initially generated.

Solid precursors utilized herein are carbon-containing precursors, for example, aromatic molecules and equivalent aromatic molecules that include halogen functional groups. These solid precursors can include naphthalene or its derivatives, 1,4-dichlorobenzene (p-DCB), 1,2-dichlorobenzene (o-DCB), other organic solid precursors, or the like. The solid precursors can be used individually, for example, phenol or pyrene, or in combination, for example, phenol and pyrene. The solid precursors sublime at low pressure to produce gaseous precursors that, due to exposure to the plasma, generate carbon-containing radicals that form the graphene domains/matrix once they nucleate on the optical fiber. Other non-carbon ions in the radicals will react with the hydrogen plasma and form gaseous molecules that may be evacuated by the vacuum pump.

In the embodiments illustrated in FIG. 1, solid precursors 120 are positioned upstream of plasma cavity 114 at a location that is separated from the peak location at which the plasma intensity is at its peak intensity. During graphene growth, the one or more solid precursors 120 sublime to produce gaseous precursors, including aromatic gases, benzene and other $C_6$-containing gases, aromatic gases with halogen functional groups, benzene and other $C_6$-containing gases with halogen functional groups, and the like. As the gaseous precursors are exposed to the plasma, radicals, also referred to as reactive or energetic species, are generated due to the plasma exposure, thereby providing carbon-containing gaseous precursors, for example, $C_2$, and/or $C_6$, for graphene growth.

In order to prevent thermal damage to the optical fiber from direct contact with the microwave/RF plasma, embodiments of the present invention locate optical fiber 130 a predetermined distance away from the center of plasma cavity 114. This predetermined distance can be measured in terms of the peak plasma intensity. For example, the optical fiber can be placed at least $3\sigma$ (i.e., 3 standard deviations) away from the center of the skewed-Gaussian-like plasma distribution, illustrated in FIG. 1. Alternatively, the optical fiber can be placed at a location in the growth chambers where the peak plasma intensity has decreased to 1/e (~36%) or 1/2e (~18%) of the peak intensity. As the plasma generator 112 is varied in peak intensity, the locations of the one or more solid precursors and/or the optical fiber can be varied to maintain a constant plasma power density at the appropriate locations.

The typical volume of the plasma region varies between 1 cm$^3$ (i.e., for plasma power in the 4-8 W range) to 4 cm$^3$ (i.e., for plasma power in the range greater than 10 W) and for flow rates lower than 22 sccm of methane and hydrogen combined. The volume of plasma region is sensitive to power and flow rate and can be adjusted so that the optical fiber is in the vicinity of the plasma, but located a predetermined distance from the location of the peak intensity of the plasma. By using the system illustrated in FIG. 1 in which both the solid precursors 120 and the optical fiber 130 are not located at the location of the peak intensity of the plasma, damage to the optical fiber can be reduced or prevented, increased control over the reaction rates can be provided, and the like.

Although the one or more solid precursors 120 are positioned in growth chamber 110 in the embodiment illustrated in FIG. 1, this is not required and, in other embodiments, the one or more solid precursors 120 are located at a position located outside the growth chamber and gaseous precursors flow into the growth chamber after sublimation of the remotely located solid precursors using suitable means.

In FIG. 1, the basic schematic of the growth chamber is illustrated, including a skewed-Gaussian plasma profile. FIG. 1 also illustrates the optical fiber in the vicinity of the plasma, but positioned away from the peak of skewed-gaussian plasma profile. Additionally FIG. 1 illustrates one possible method to distribute the solid organic precursors along the length of the growth chamber (e.g., a quartz chamber) so that the pump will draw the gas phase organic molecules towards the plasma where they can deposit on the optical fiber. Of course, variations of this system are included within the scope of the present invention.

Figure 2:
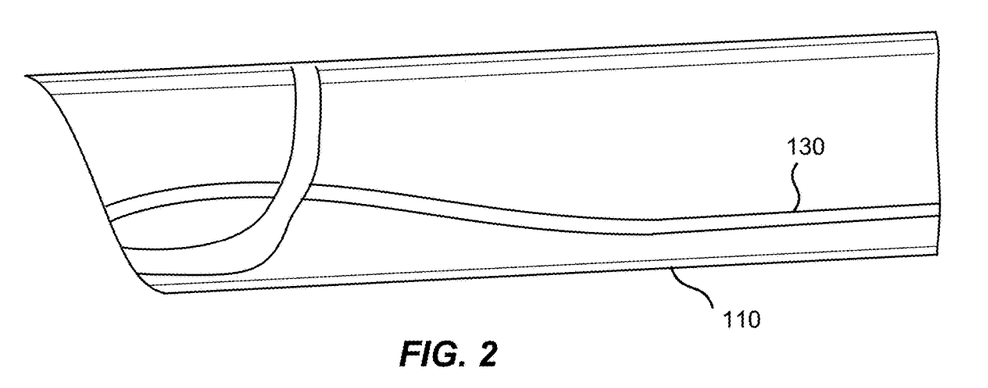
FIG. 2 is a simplified drawing illustrating positioning of an optical fiber in a processing chamber according to an embodiment of the present invention.

FIG. 2 is a simplified drawing illustrating positioning of an optical fiber in a processing chamber according to an embodiment of the present invention. As illustrated in FIG. 2, optical fiber 130, which can be a poly(methyl methacrylate) (PMMA)-based, plastic optical fiber, is placed on the bottom of growth chamber 110 (e.g., a quartz process chamber) at a predetermined distance from plasma cavity 114 illustrated in FIG. 1. In the embodiment illustrated in FIG. 2, the optical fiber is positioned on the bottom of the growth chamber so that the condition where the plasma intensity is below the intensity peak and still present at the optical fiber is met. The inventors have determined that graphene growth is facilitated by providing some direct plasma to the optical fiber (i.e., to ensure that the $C_2$ radicals produced from methane gas dissociation are available to seed the growth of the graphene), but at a plasma intensity that is less than the peak plasma intensity present at other locations in the growth chamber (e.g., on the top portion of the growth chamber).

During graphene growth, some growth processes raise the plasma power to a high initial power level, for example, on the order of 12-15 W, in order to facilitate nucleation of active radicals, followed by a decrease in the plasma power, for example, a gradual decrease to a subsequent power level, for example, on the order of 4-5 W. The plasma power can be reduced further depending on the lowest stable plasma power supported by the microwave generator, which varies by instrument manufacturer. The inventors have determined that beneficial graphene growth occurs when the growth begins with sufficiently energetic carbon radicals in the growth chamber, but the plasma power is reduced (e.g., quickly) to prevent sustained thermal damage or melting of the optical fiber.

In some embodiments, the flow rate of hydrogen was 9 times (e.g., up to 10 times) greater than the flow rate of methane. In a particular embodiment, flow rates of 10 sccm of hydrogen and 1 sccm of methane were utilized in conjunction with the solid organic precursors during graphene growth. Without limiting embodiments of the present invention, the inventors believe that the excess hydrogen is useful in helping create free radical forms of the $C_2$ and $C_6$ from the solid precursor.

Figure 3:
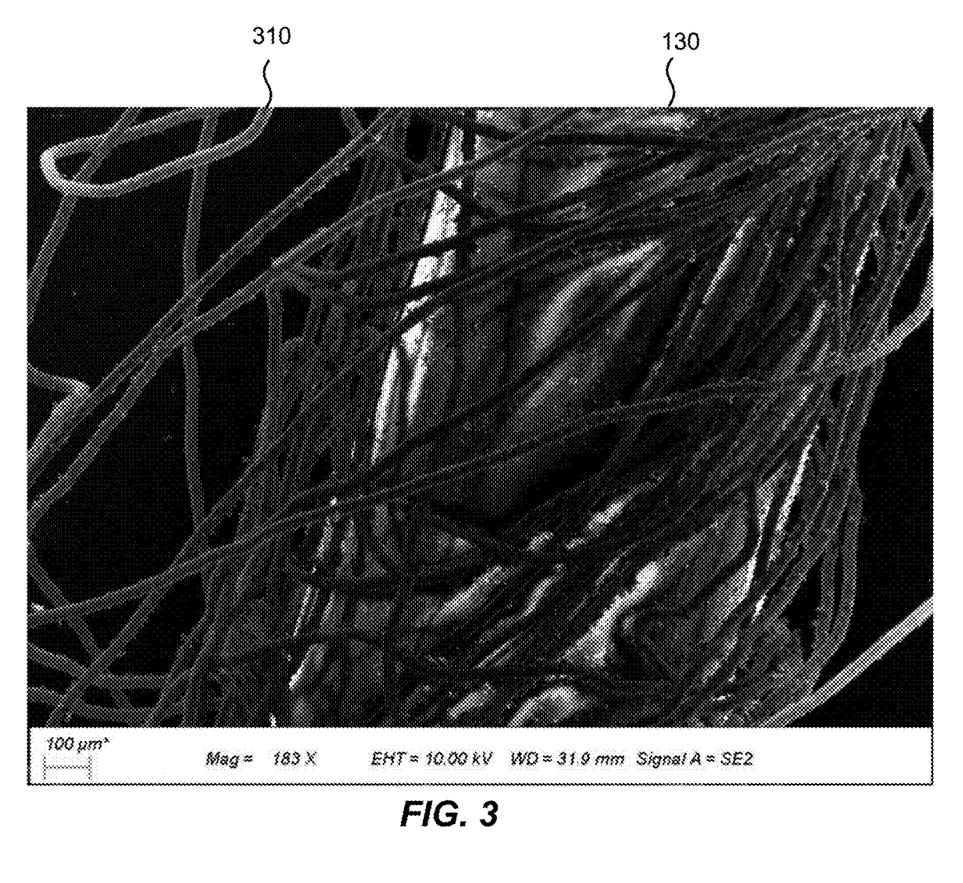
FIG. 3 is an image illustrating the use of a shielding structure for the optical fiber according to an embodiment of the present invention.

FIG. 3 is an image illustrating the use of a shielding structure for the optical fiber according to an embodiment of the present invention. The inventors have determined that shielding the optical fiber from exposure to direct plasma results in improved nucleation and growth of graphene on the optical fiber. In FIG. 3, thin gold wires 310 are loosely wrapped around the optical fiber and utilized to surround optical fiber 130, effectively creating a mesh surrounding the optical fiber. The thin gold wires break the laminarity of the flow of gases (e.g., methane and hydrogen) as the gases flow past the optical fiber, enabling the active precursors to nucleate on the surface of the optical fiber (or on a nucleation layer as discussed in relation to FIG. 5B). Although thin gold wires are illustrated in FIG. 3, other structures that can disrupt the laminar flow while still allowing reactive species to reach the optical fiber are included within the scope of the present invention. These alternative structures are discussed below.

Additionally, the thin gold wires provide a permeable, physical barrier to the plasma, shielding the optical fiber from direct plasma and energetic radicals and reducing or preventing thermal damage to the optical fiber while still allowing nucleation of graphene growth on the optical fiber. Additionally, the presence of a thin gold mesh around the optical fiber provides good thermal conduction so that the heat generated by plasma can be more uniformly distributed around the optical fiber and also more efficiently conducted away from the optical fiber. Although thin gold wires 310 are illustrated in FIG. 3, embodiments of the present invention are not limited to this particular implementation and wires made of other materials, including copper, as well as other shielding structures, including corrugated structures, mesh-based structures, or the like can be utilized.

Figure 4A:
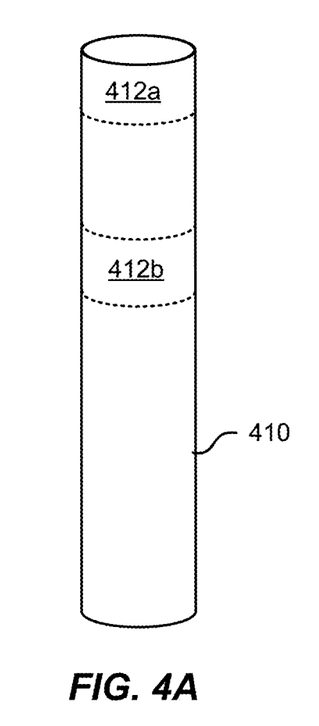
FIGS. 4A-4C are simplified schematic diagrams illustrating graphene growth on predetermined regions of an optical fiber according to an embodiment of the present invention.
Figure 4B:
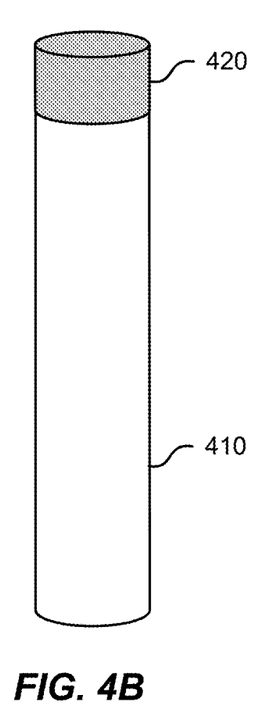
Figure 4C:
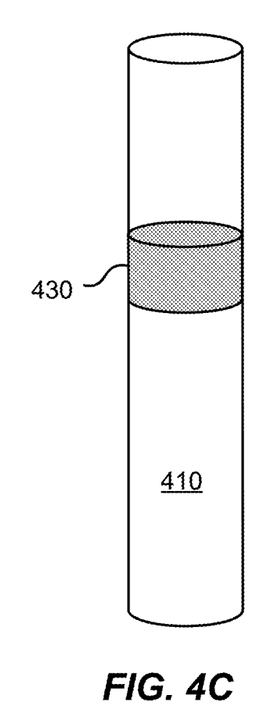

FIGS. 4A-4C are simplified schematic diagrams illustrating graphene growth on predetermined regions of an optical fiber according to an embodiment of the present invention. FIG. 4A illustrates an optical fiber 410 prior to the graphene growth process. Optical fiber 410 includes one or more regions 412 where graphene growth can occur. In particular region 412a is a region positioned at the tip of optical fiber 410. Region 412b is a region that defines a limited area of the optical fiber. Region 412a and 412b are not contiguous, but can be contiguous in other embodiments. Regions 512 are distributed along the length of the optical fiber (measured along the z-axis). As described more fully below, thin film coatings formed in one or more of regions 412 can be utilized as a nucleation layer on which graphene growth occurs.

FIG. 4B illustrates formation of a nucleation layer 420 at region 412a of optical fiber 410. Although nucleation layer 420 is illustrated on the surface of optical fiber 410 facing along the positive x-axis, it will be appreciated that nucleation layer 420 surrounds the cylindrical shape of the optical fiber. As described more fully herein, graphene growth on the cylindrical surface of optical fiber 510 is facilitated by the presence of nucleation layer 420. In some embodiments, a thin film metal coating, for example, a copper film, a gold film, a silver film, a nickel film, an aluminum film, a cobalt film, a platinum film, an iridium film, other transition metal films, or the like, can be deposited on nucleation layer 420 in nucleation region 412a. The nucleation layer 420 serves as a growth surface on which graphene growth can nucleate in comparison with the regions of the optical fiber not coating with the material of the nucleation region.

FIG. 4C illustrates formation of a nucleation layer 430 at region 412b of optical fiber 410. Although nucleation layer 430 is illustrated on the surface of optical fiber 410 facing along the positive x-axis, it will be appreciated that nucleation layer 430 surrounds the cylindrical shape of the optical fiber. Referring to FIGS. 4B and 4C, nucleation layer 420 can be utilized to nucleate graphene growth at the tip of the optical fiber in region 412a and nucleation layer 430 can be utilized to nucleate graphene growth in a limited area of the optical fiber, illustrated as region 412b. In some embodiments, graphene growth is limited to the regions of the optical fiber covered with a nucleation layer, whereas, in other embodiments, the nucleation layer helps to nucleate growth along the length of the optical fiber in regions other than the nucleation regions. Although two separate nucleation regions are illustrated in FIGS. 4B and 4C, additional nucleation regions of differing size can be implemented.

Figure 5A:
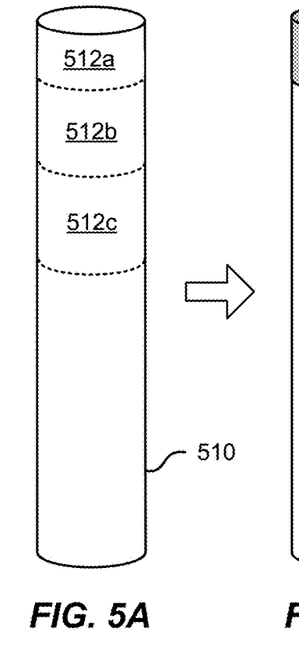
FIGS. 5A-5D are simplified schematic diagrams illustrating nucleated graphene growth on an optical fiber according to an embodiment of the present invention.

FIGS. 5A-5D are simplified schematic diagrams illustrating nucleated graphene growth on an optical fiber according to an embodiment of the present invention. FIG. 5A illustrates an optical fiber 510 prior to the graphene growth process. Optical fiber 510 includes one or more regions 512 where graphene growth can occur. In particular, nucleation region 512a, which will be utilized as a nucleation region as described more fully below, region 512b, which is contiguous with nucleation region 512a, and region 512c, which is contiguous with region 512b, are illustrated. Regions 512 are distributed along the length of the optical fiber (measured along the z-axis). Although nucleation region 512a, region 512b, and region 512c are contiguous in FIG. 5A, this is not required and the one or more regions of the optical fiber can be distributed along the optical fiber 510 in other configurations. One of ordinary skill in the art would recognize many variations, modifications, and alternatives.

Although a uniform diameter optical fiber 510 is illustrated in FIG. 5A, it will be appreciated that the optical fiber can have a portion of the cladding removed, forming a reduced cladding optical fiber or an optical fiber in which the fiber core is exposed. Graphene structures formed in the proximity to the fiber core can be utilized to modulate the effective refractive index of the optical fiber, which can be useful in a variety of optical devices including modulators. Thus, the uniform diameter optical fiber 510 illustrated in FIG. 5A is merely exemplary and one of skill in the art will appreciate that the optical fiber can have a diameter that varies along the z-axis.

Figure 5B:
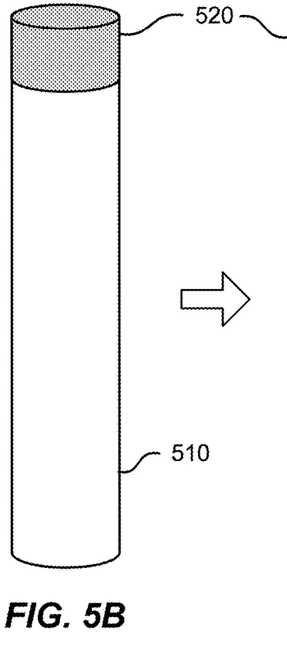

FIG. 5B illustrates formation of a nucleation layer 520 at nucleation region 512a of optical fiber 510. Although nucleation layer 520 is only illustrated on the surface of optical fiber 510 facing along the positive x-axis, it will be appreciated that nucleation layer 520 surrounds the cylindrical shape of the optical fiber. As described more fully herein, graphene growth on the cylindrical surface of optical fiber 510 is facilitated by the presence of nucleation layer 520. In some embodiments, a thin film metal coating, for example, a copper film, a gold film, a silver film, a nickel film, an aluminum film, a cobalt film, other transition metal films, or the like, can be deposited in nucleation region 512a. The nucleation layer 520 formed in nucleation region 512a serves as a growth surface on which graphene growth can nucleate in comparison with the regions of the optical fiber not coated with the material of the nucleation region.

Figures 5C, 5D:
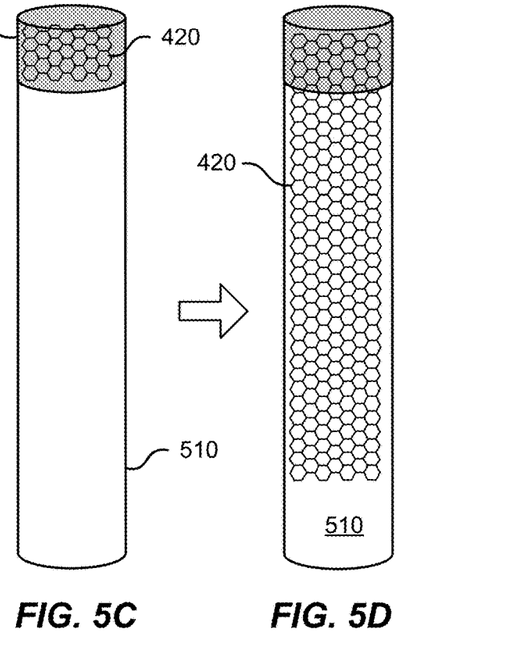

Referring to FIG. 5C, graphene growth in the form of graphene layer 530 is illustrated on nucleation layer 520. As discussed in relation to FIG. 2, graphene can be formed on nucleation layer 520 as the optical fiber 510 is exposed to $C_6$ and $C_2$ precursors generated by the plasma in the growth chamber. Although graphene layer 530 is only illustrated on the surface of optical fiber 510 facing along the positive x-axis, it will be appreciated that graphene layer 530 surrounds the cylindrical shape of the optical fiber. Since carbon has a higher mobility on the nucleation layer 520 than on the regions of the optical fiber not including a nucleation layer, graphene growth occurs preferentially on the nucleation layer as shown in FIG. 5C.

Referring to FIG. 5D, as graphene growth proceeds, graphene layer 530 acts as a seed and a graphene layer extends on the surface of the optical fiber 510 along the negative z-direction, forming an extended graphene layer 540. Although graphene layer 530 surrounds the cylindrical shape of the optical fiber, this graphene growth process can be considered a quasi-one-dimensional growth process as the graphene growth extends along the length of the optical fiber to form extended graphene layer 540, which also surrounds the cylindrical shape of the optical fiber.

Another alternative embodiment is to coat the thin metal film as a substrate to seed growth on one portion of the optical fiber and then to allow the graphene to grow to the surrounding regions. Metals like copper, platinum, nickel, gold, iridium, and the like can be utilized. In FIG. 4C, the metal coating is illustrated in a central region; however, as illustrated in FIG. 4B, the metal coating could also be present at the end of a fiber tip to take advantage of the field enhancement at the tip to help nucleate graphene growth.

This multi-layer graphene is also pristine in the sense that it does not have any other metal contaminants that can be found in copper substrate-based chemical vapor deposition growth of graphene, or the use of multi-functional group precursors.

Figure 6:
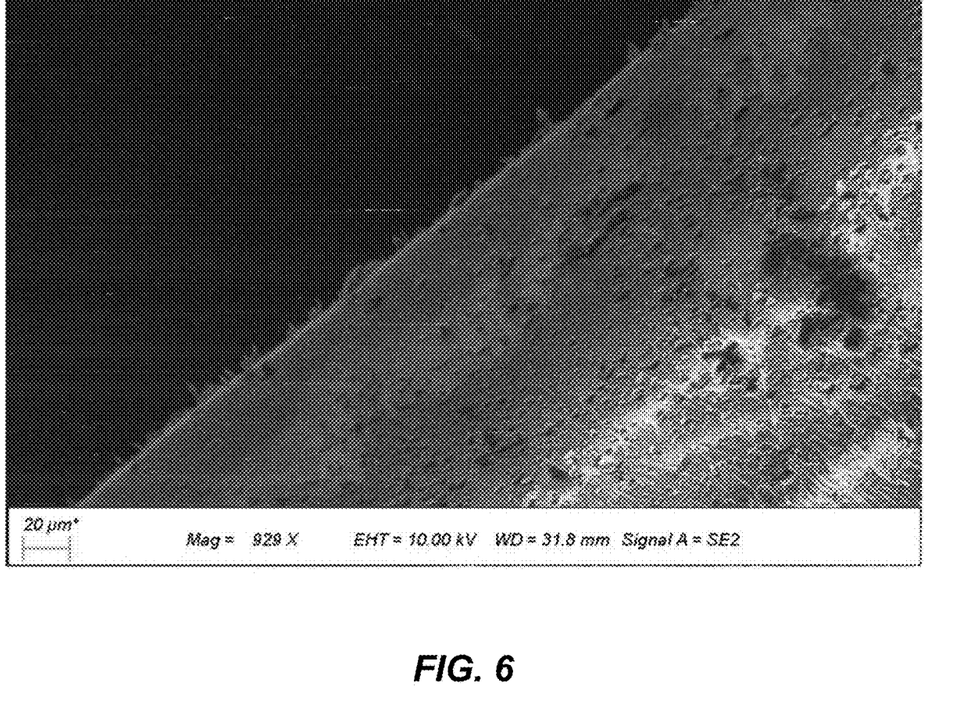
FIG. 6 is an image illustrating multi-layer graphene grown on an optical fiber according to an embodiment of the present invention.

FIG. 6 is an image illustrating multi-layer graphene grown on an optical fiber according to an embodiment of the present invention. Referring to FIG. 6, a scanning electron micrograph (SEM) of an optical fiber with multi-layer graphene is illustrated. As can be seen in FIG. 6, complete coverage of the optical fiber is accomplished. In addition to graphene layers adhered to the optical fiber, some out-of-plane graphene flakes grown from the substrate are evident at the edge of the optical fiber. The inventors believe, without limiting embodiments of the present invention, that these graphene flakes result from graphene growing on nucleation sites on the previously grown graphene.

Figure 7:
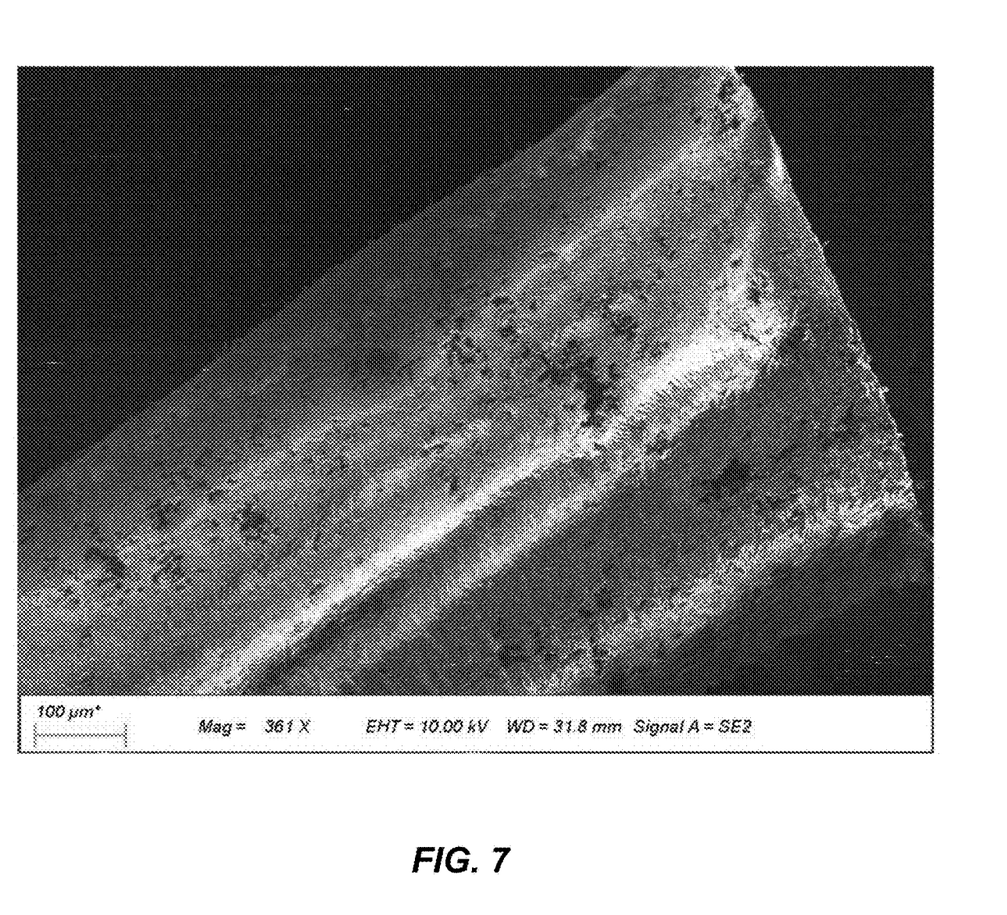
FIG. 7 is an image illustrating complete coverage of multi-layer graphene grown on an optical fiber according to an embodiment of the present invention.

FIG. 7 is an image illustrating complete coverage of multi-layer graphene grown on an optical fiber according to an embodiment of the present invention. In FIG. 7, the end of the optical fiber is illustrated with the graphene completely covering the optical fiber.

Figure 8:
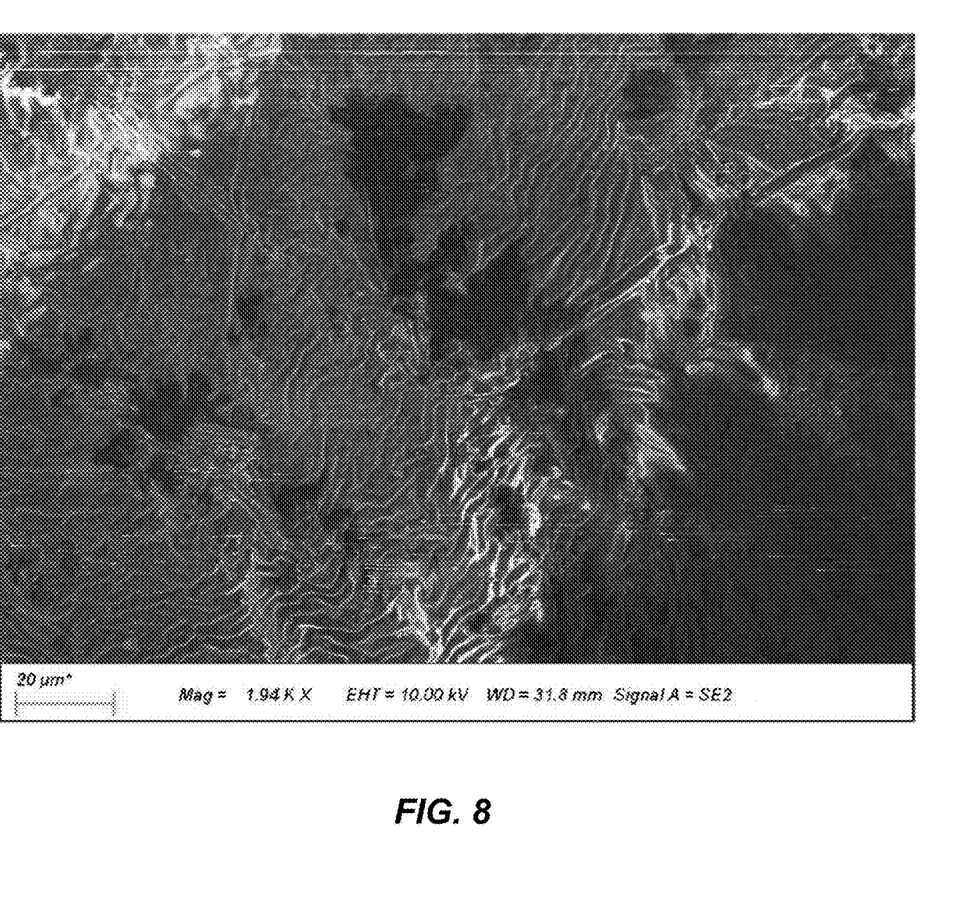
FIG. 8 is an image illustrating horizontal sheets of graphene with wrinkles grown on an optical fiber according to an embodiment of the present invention.

FIG. 8 is an image illustrating horizontal sheets of graphene with wrinkles grown on an optical fiber according to an embodiment of the present invention. The image shown in FIG. 8 is of a magnified portion of the image shown in FIG. 7, effectively providing a plan view of the optical fiber with the graphene grown on the optical fiber. Thickness variation is illustrated by differing brightness in the image.

Figure 9:
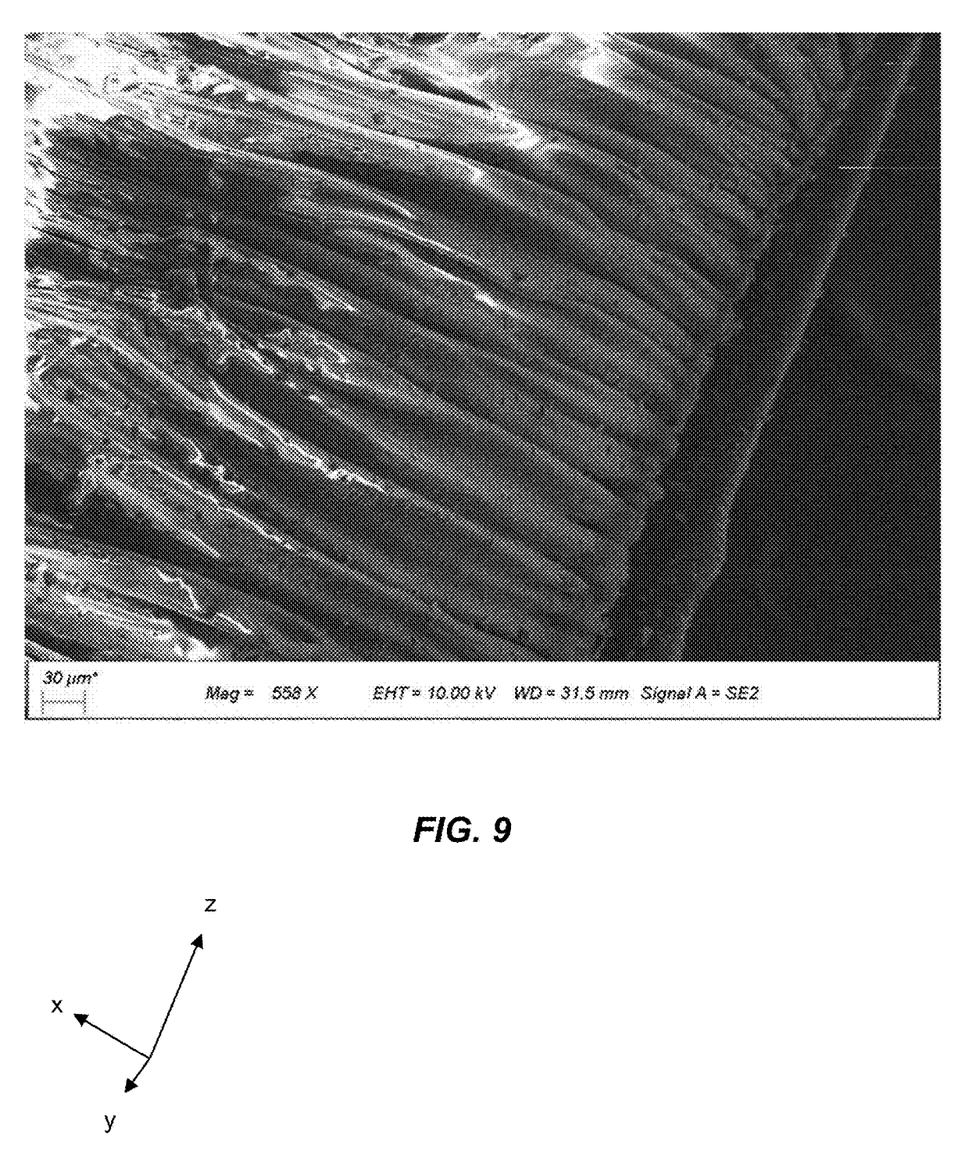
FIG. 9 is an image illustrating wrinkled graphene grown on an optical fiber under mechanical stress according to an embodiment of the present invention.

FIG. 9 is an image illustrating wrinkled graphene grown on an optical fiber under mechanical stress according to an embodiment of the present invention. As illustrated in FIG. 9, the optical fiber is oriented along the z-direction and the graphene is characterized by variations in height parallel to the orientation of the optical fiber. Without limiting embodiments of the present invention, the inventors believe that motion of the optical fiber along the direction of orientation during graphene growth can be utilized to fabricate graphene with the variation in height shown in FIG. 9. Moreover, defects (e.g., sharp edges on the surface of the optical fiber) or mechanical stress introduced along the orientation direction may, at least partially, result in the variation in height shown in FIG. 9. Accordingly, the introduction of periodic or aperiodic structures on the surface of the optical fiber can be utilized to seed graphene growth characterized by height variations. Thus, depending on the growth process, smooth or modulated graphene layers can be grown using the methods and systems described herein.

Figure 10:
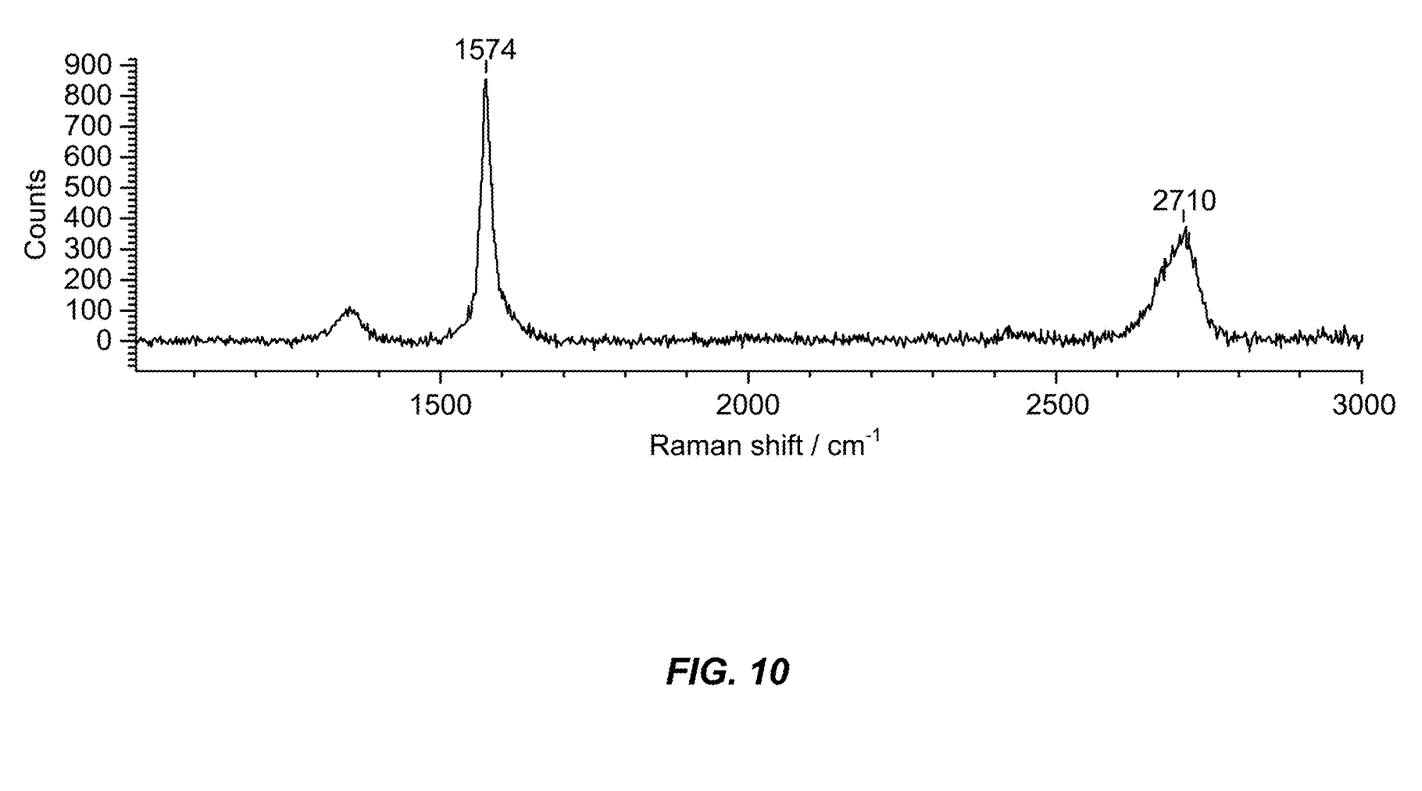
FIG. 10 is a plot of Raman spectra for pristine Graphene on an optical fiber according to an embodiment of the present invention.

FIG. 10 is a plot of Raman spectra for pristine graphene on an optical fiber according to an embodiment of the present invention. The small Raman peak at the D band (at ~1350 $cm^{-1}$) is most likely from the mechanical stress induced on the graphene causing some wrinkles and folds and some grain boundaries, all of which can contribute to the D peak. In FIG. 10, it is also possible to note the narrow linewidth of the G band, which results from the primary in-plane vibration mode, at 1574 $cm^{-1}$, indicating high quality graphene and the 2D peak at 2710 $cm^{-1}$. The broadening and reduced intensity of this peak is indicative of multi-layer graphene. The 2D/G ratio is close to 0.44, which also confirms the presence of multi-layer graphene. These Raman spectra are collected using 514 nm laser excitation with an optical power of less than 5 mW.

Figure 11:
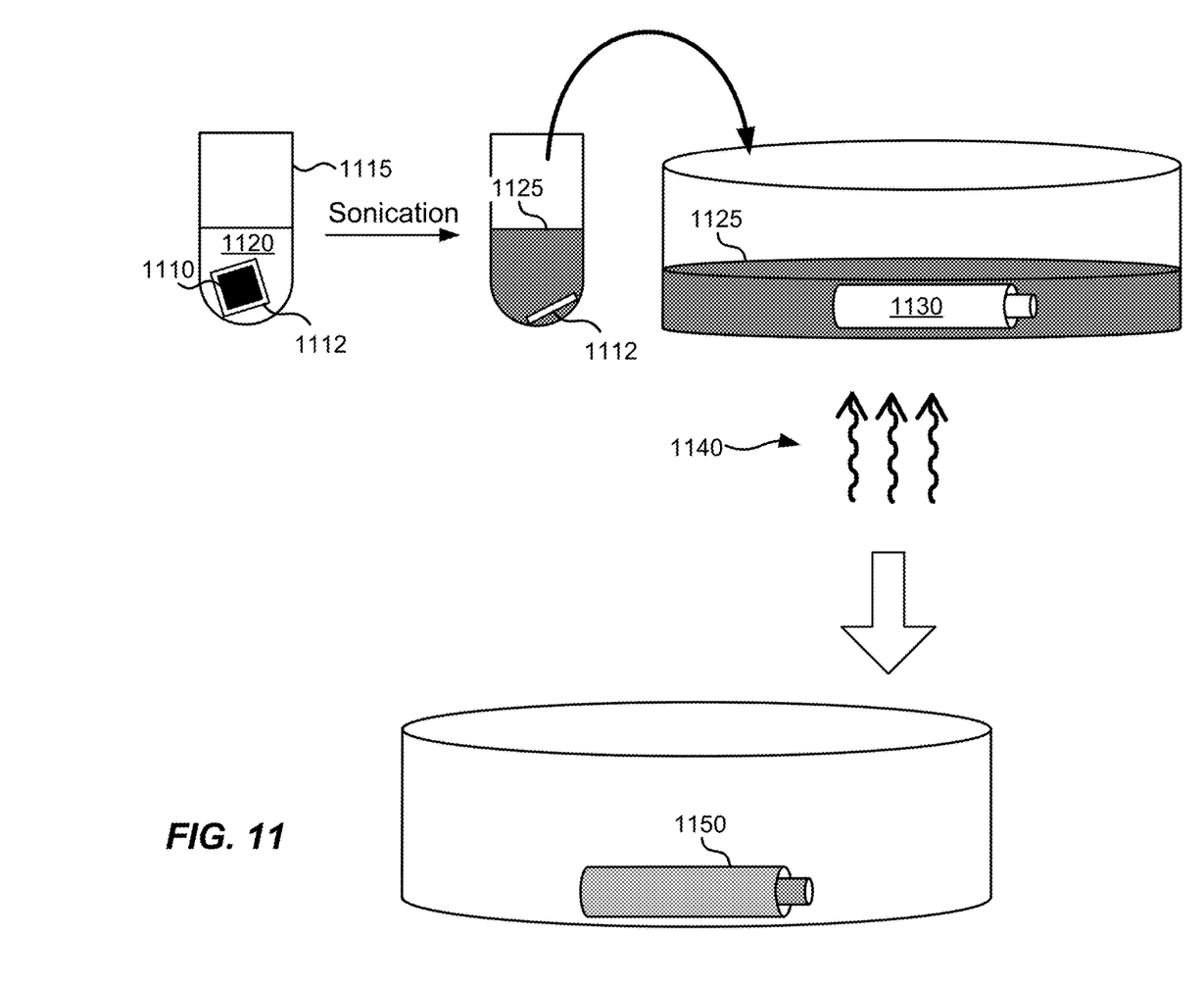
FIG. 11 is a simplified schematic diagram illustrating a process for liquid exfoliate adhesion of graphene on an optical fiber according to an embodiment of the present invention.
Figure 12:
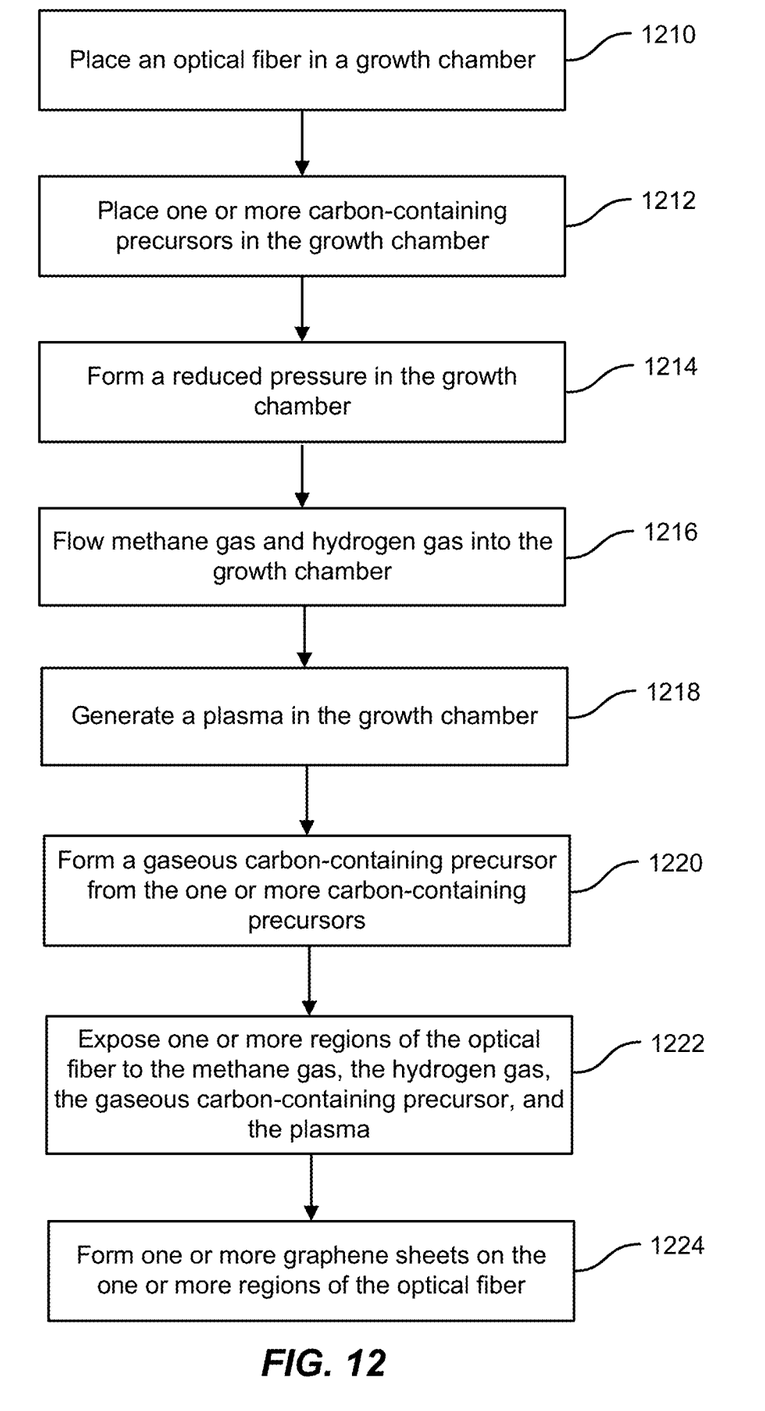
FIG. 12 is a simplified flowchart illustrating a method of growing graphene on an optical fiber according to an embodiment of the present invention.

FIG. 11 is a simplified schematic diagram illustrating a process for liquid exfoliate adhesion of graphene on an optical fiber according to an embodiment of the present invention. This alternate process for integrating graphene nanomaterials on optical fibers, specifically depositing PECVD graphene on an optical fiber, can include the use of adhesive films, evaporative coating from a liquid phase exfoliated graphene dispersion, or the like, as shown in FIG. 12.

The liquid exfoliate adhesion process starts with graphene 1110 grown on a substrate 1112, for example, a copper substrate as illustrated in FIG. 11 using a PECVD growth process. The graphene 1110 grown on the substrate 1112 is placed in a solvent 1120 inside a vessel 1115. The solvent 1120 can be a variety of liquids in which graphene dissolves, including n-methyl pyrrolidone (NMP) or other suitable organic solvent, including toluene, chloroform, alcohol, water, or the like. In response to the application of sonic energy to vessel 1115, graphene 1110 dissolves in the presence of solvent 1120, resulting in the production of graphene dispersion 1125 in vessel 1115.

After exfoliating the graphene, a cladding etched optical fiber 1130 is immersed in graphene dispersion 1125. The cladding etched optical fiber 1130 can be fabricated by using a buffered hydrofluoric acid solution to expose only the core of the optical fiber. The cladding etched optical fiber 1130 can be a spool of fiber or other suitable fiber geometry. Moreover, in addition to the immersion of a single cladding etched optical fiber in the graphene dispersion as shown in FIG. 11, multiple optical fibers can be immersed. Additionally, portions of the cladding etched optical fiber 1130 can be coated with a sacrificial material that is subsequently removed, resulting in patterned graphene in which separate regions of the optical fiber are coated with graphene and other regions are free of graphene. As an example, a bundle of different optical fibers, each patterned with a same or different pattern, could be immersed in the graphene dispersion concurrently in order to coat predetermined regions of each of the optical fibers concurrently.

As illustrated at process 1140, the graphene dispersion 115 is heated or exposed to a vacuum environment to evaporate the solvent 1120 present in the graphene dispersion 1125, resulting in the optical fiber being fully coated with graphene as the graphene adheres to the surface of the cladding etched optical fiber 1130 as illustrated by cladding etched optical fiber coated with graphene 1150.

In the embodiment illustrated in FIG. 11, a cladding etched optical fiber is utilized so that the optical mode propagating in the optical fiber can experience strong interaction with the graphene, however, in other embodiments, optical fibers other than cladding etched optical fibers can be utilized with the process shown in FIG. 11. Moreover, the thickness of the graphene can be controlled via control of the PECVD growth process and/or the solvent evaporation process. Additionally, doping of the PECVD graphene or other graphene characteristics are controllable using embodiments of the present invention.

A variety of types of optical fibers can be utilized according to various embodiments of the present invention. As an example, PMMA-based plastic optical fibers can be utilized during the graphene growth process. Moreover, embodiments of the present invention are applicable to a wide variety of optical fiber dimensions, including single mode glass optical fiber that has core/cladding diameter size in the range of 10/125 µm, multimode glass optical fiber that has core/cladding diameter size in the range of 50/125 µm, hard clad silica optical fiber (HCSF) that has core/cladding diameter size in the range of 200/230 µm, and plastic optical fiber that has core/cladding diameter size in the range of 980/1000 µm. It should be noted that methods and systems suitable for direct graphene growth on plastic optical fiber can be extended to glass optical fibers because glass fibers have better endurance to temperature than plastic optical fibers during PECVD growth.

FIG. 12 is a simplified flowchart illustrating a method of growing graphene on an optical fiber according to an embodiment of the present invention. The method is useful for growing one or more graphene sheets on one or more regions of the optical fiber using plasma-enhanced chemical vapor deposition (PECVD). The optical fiber can include a polymer material. The method includes placing the optical fiber in a growth chamber (1210) and placing one or more carbon-containing precursors in the growth chamber (1212). Prior to placing the optical fiber in the growth chamber, the method can include removing a portion of a cladding in the one or more regions of the optical fiber. The one or more carbon-containing precursors can be solid precursors and can contain benzene, $C_6$, or an aromatic compound. Additionally, the one or more carbon-containing precursors can include one or more halogen functional groups. In other embodiments, the one or more carbon-containing precursors can be a liquid precursor.

The method also includes forming a reduced pressure in the growth chamber (1214), flowing methane gas and hydrogen gas into the growth chamber (1216), and generating a plasma (e.g., a microwave plasma) in the growth chamber (1218). During generation of the plasma, the growth surface of the optical fiber can be characterized by a growth temperature less than 400° C. The plasma can be characterized by a peak plasma intensity located at a peak location, the one or more carbon-containing precursors can be located at a first position offset from the peak plasma intensity location, and the optical fiber can be located at a second position offset from the peak plasma intensity location. As an example, the first position can be upstream of the peak plasma intensity location and the second position can be downstream of the peak plasma intensity location.

The method further includes forming a gaseous carbon-containing precursor from the one or more carbon-containing precursors (1220), exposing the one or more regions of the optical fiber to the methane gas, the hydrogen gas, the gaseous carbon-containing precursor, and the plasma (1222), and forming the one or more graphene sheets on the one or more regions of the optical fiber (1224). The gaseous carbon-containing precursors can include at least one or more of $C_2$, $C_6$, $C_6H_6$, CN, or HCN. In some embodiments, the method also includes forming a nucleation layer in a nucleation region on one of the one or more regions of the optical fiber. In these embodiments, forming the one or more graphene sheets on the one or more regions of the optical fiber can include initiating graphene growth on the nucleation layer. Moreover, in other embodiments, the method includes providing a shielding structure surrounding the optical fiber, for example, a plurality of wires surrounding the optical fiber.

It should be appreciated that the specific steps illustrated in FIG. 12 provide a particular method of growing graphene on an optical fiber according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 13:
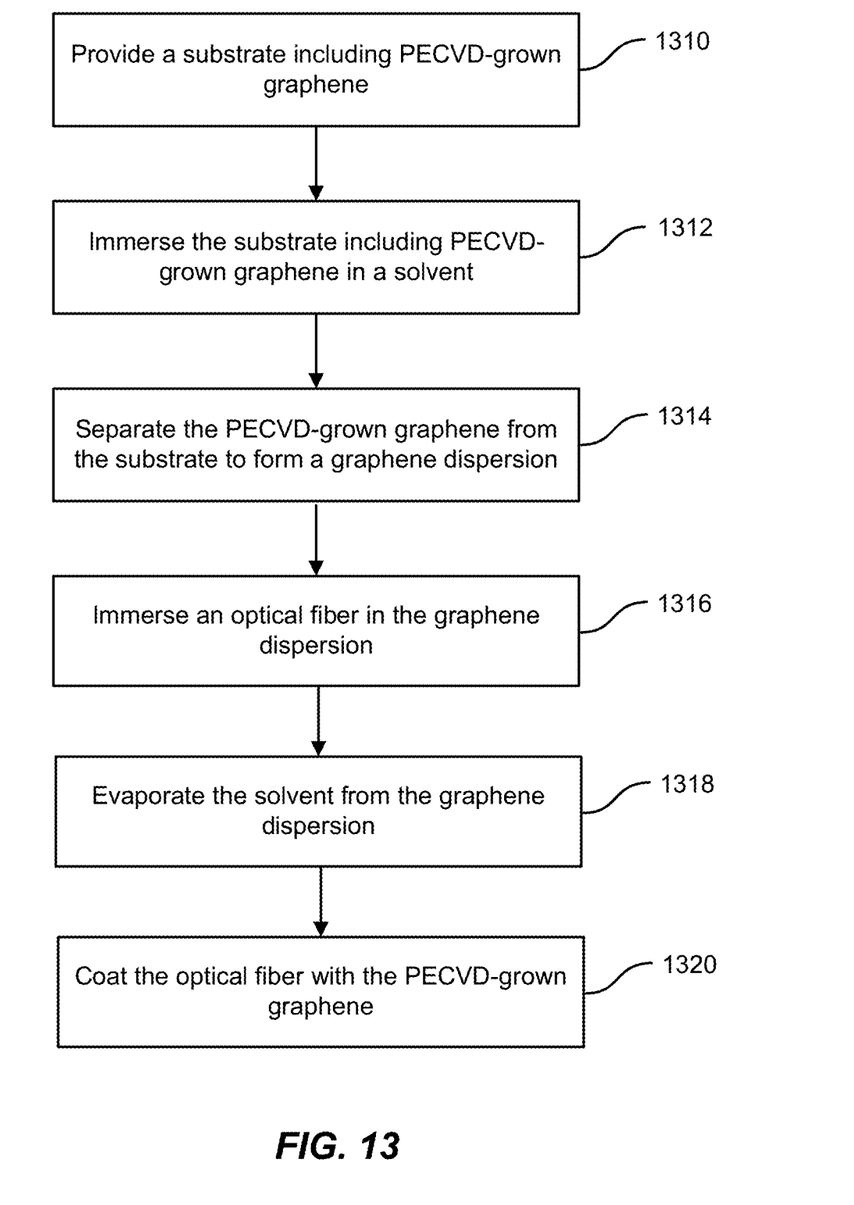
FIG. 13 is a simplified flowchart illustrating a method of adhering graphene to an optical fiber using a liquid exfoliate process according to an embodiment of the present invention.

FIG. 13 is a simplified flowchart illustrating a method of fabricating a graphene coated optical fiber using a liquid exfoliate process according to an embodiment of the present invention. The optical fiber can include a polymer material and can be a cladding etched optical fiber. The method includes providing a substrate including PECVD-grown graphene (1310), immersing the substrate including PECVD-grown graphene in a solvent (1312), and separating the PECVD-grown graphene from the substrate to form a graphene dispersion (1314). The substrate can be copper and the solvent can be n-methyl pyrrolidone. Separating the PECVD-grown graphene from the substrate can include performing a sonication process.

The method also includes immersing an optical fiber in the graphene dispersion (1316), evaporating the solvent from the graphene dispersion (1318), and coating the optical fiber with the PECVD-grown graphene (1320). In some embodiments, concurrently with immersing the optical fiber in the graphene dispersion, additional optical fibers can be immersed in the graphene dispersion. In other embodiments, prior to immersing the optical fiber in the graphene dispersion, the method can include patterning predetermined regions of the optical fiber with a sacrificial material.

It should be appreciated that the specific steps illustrated in FIG. 13 provide a particular method of fabricating a graphene coated optical fiber according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of growing one or more graphene sheets on one or more regions of an optical fiber using plasma-enhanced chemical vapor deposition (PECVD), the method comprising:
   placing the optical fiber in a growth chamber;
   providing a shielding structure surrounding the optical fiber;
   placing one or more carbon-containing precursors in the growth chamber;
   forming a reduced pressure in the growth chamber;
   flowing methane gas and hydrogen gas into the growth chamber;
   generating a plasma in the growth chamber;
   forming a gaseous carbon-containing precursor from the one or more carbon-containing precursors;
   exposing the one or more regions of the optical fiber to the methane gas, the hydrogen gas, the gaseous carbon-containing precursor, and the plasma; and
   concurrently providing the shielding structure surrounding the optical fiber and forming the one or more graphene sheets on the one or more regions of the optical fiber.

2. The method of claim 1 wherein the one or more carbon-containing precursors comprise one or more solid precursors.

3. The method of claim 1 wherein the one or more carbon-containing precursors comprise benzene, $C_6$, or an aromatic compound.

4. The method of claim 1 wherein the gaseous carbon-containing precursor comprises at least one or more of $C_2$, $C_6$, $C_6H_6$, HCN, or CN.

5. The method of claim 1 wherein, during generation of the plasma, a growth surface of the optical fiber is characterized by a growth temperature less than 500° C.

6. The method of claim 1 wherein the optical fiber comprises a polymer material.

7. The method of claim 1 further comprising forming a nucleation layer in a nucleation region on one of the one or more regions of the optical fiber.

8. The method of claim 7 wherein growing the one or more graphene sheets on the one or more regions of the optical fiber comprises initiating graphene growth on the nucleation layer.

9. The method of claim 1 wherein the shielding structure comprises a plurality of wires surrounding the optical fiber.

10. The method of claim 9 wherein the plurality of wires comprise gold wires.

11. The method of claim 1 wherein:
   the plasma is characterized by a peak plasma intensity located at a peak plasma intensity location;
   the one or more carbon-containing precursors is located a first position offset from the peak plasma intensity location; and
   the optical fiber is located at a second position offset from the peak plasma intensity location.

12. The method of claim 11 wherein the first position is upstream of the peak plasma intensity location and the second position is downstream of the peak plasma intensity location.

13. The method of claim 1 wherein the optical fiber is characterized by a cylindrical periphery and the one or more graphene sheets are formed on the cylindrical periphery.

14. The method of claim 1 wherein the optical fiber comprises a cladding etched optical fiber.

15. The method of claim 1 wherein the optical fiber is positioned in the growth chamber downstream of the plasma.

16. The method of claim 7 wherein the nucleation layer comprises a metal layer.

17. The method of claim 16 wherein the metal layer comprises copper.

18. The method of claim 16 wherein the metal layer comprises gold.

19. The method of claim 16 wherein the metal layer comprises silver.

20. The method of claim 16 wherein the metal layer comprises nickel.

* * * * *